(12) United States Patent
Geisler et al.

(10) Patent No.: US 8,479,578 B2
(45) Date of Patent: Jul. 9, 2013

(54) ASSESSING METAL STACK INTEGRITY IN SOPHISTICATED SEMICONDUCTOR DEVICES BY MECHANICALLY STRESSING DIE CONTACTS

(75) Inventors: Holm Geisler, Dresden (DE); Matthias Lehr, Dresden (DE); Frank Kuechenmeister, Dresden (DE); Michael Grillberger, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 365 days.

(21) Appl. No.: 12/939,471

(22) Filed: Nov. 4, 2010

(65) Prior Publication Data
US 2011/0209548 A1 Sep. 1, 2011

(30) Foreign Application Priority Data
Feb. 26, 2010 (DE) .......................... 10 2010 002 453

(51) Int. Cl.
*G01N 29/04* (2006.01)
*G01N 3/00* (2006.01)
*G01N 23/00* (2006.01)

(52) U.S. Cl.
USPC ................................. 73/627; 73/788; 250/311

(58) Field of Classification Search
USPC .................. 73/627, 788; 250/311; 324/754.25
See application file for complete search history.

(56) References Cited

U.S. PATENT DOCUMENTS

| | | | |
|---|---|---|---|
| 6,614,243 B2* | 9/2003 | Klehn et al. | 324/754.21 |
| 7,923,849 B2* | 4/2011 | Fogel et al. | 257/778 |
| 7,973,547 B2* | 7/2011 | Nitsch et al. | 324/754.25 |
| 7,982,313 B2* | 7/2011 | Grillberger et al. | 257/758 |
| 8,030,209 B2* | 10/2011 | Werner et al. | 438/645 |

* cited by examiner

*Primary Examiner* — J M Saint Surin
(74) *Attorney, Agent, or Firm* — Williams, Morgan & Amerson, P.C.

(57) ABSTRACT

The metallization system of complex semiconductor devices may be evaluated in terms of mechanical integrity on the basis of a measurement system and measurement procedures in which individual contact elements, such as metal pillars or solder bumps, are mechanically stimulated, while the response of the metallization system, for instance in the form of directly measured forces, is determined in order to quantitatively evaluate mechanical status of the metallization system. In this manner, the complex material systems and the mutual interactions thereof may be efficiently assessed.

28 Claims, 5 Drawing Sheets

ASSESSING METAL STACK INTEGRITY IN SOPHISTICATED SEMICONDUCTOR DEVICES BY MECHANICALLY STRESSING DIE CONTACTS

BACKGROUND OF THE INVENTION

1. Field of the Invention

Generally, the present disclosure relates to integrated circuits, and, more particularly, to sophisticated metallization systems including sensitive dielectric materials and lead-free bumps or metal pillars for connecting a chip to a package.

2. Description of the Related Art

Semiconductor devices, such as microprocessors, SRAMs, ASICs (application specific ICs), systems on chip (SoC) and the like, are typically formed on appropriate substrate materials, such as silicon and the like, wherein the individual integrated circuits are arranged in an array on a wafer, so that most of the manufacturing steps, which may involve several hundred and more individual process steps in sophisticated integrated circuits, are performed simultaneously for all chip areas on the substrate, except for photolithography processes, metrology processes and packaging of the individual devices after dicing the substrate. Thus, economic constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the feature sizes of circuit elements are steadily scaled down. Due to this ongoing demand for shrinking the feature sizes of highly sophisticated semiconductor devices, copper, in combination with low-k dielectric materials, has become a frequently used alternative for the formation of so-called interconnect structures comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to implement the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased, in combination with a reduced conductivity of the lines, due to a reduced cross sectional area. For this reason, traditional dielectrics such as silicon dioxide (k>4) and silicon nitride (k>7) are replaced by dielectric materials having a lower permittivity, which are, therefore, also referred to as low-k dielectrics, having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of these sensitive dielectric materials and their adhesion to other materials.

In addition to the problems of reduced mechanical stabilities of advanced dielectric materials having a dielectric constant of 3.0 and significantly less, device reliability may be affected by these materials during operation of sophisticated semiconductor devices due to an interaction between the chip and the package caused by a thermal mismatch of the corresponding thermal expansion of the different materials. For instance, in the fabrication of complex integrated circuits, increasingly a contact technology may be used in connecting the package carrier to the chip, which is known as flip chip packaging technique. Contrary to the well-established wire bonding techniques in which appropriate contact pads may be positioned at the periphery of the very last metal layer of the chip, which may be connected to corresponding terminals of the package by a wire, in the flip chip technology, a respective bump structure may be formed on the last metallization layer, for instance using aluminum as a terminal metal, in combination with a solder material which may be brought into contact with respective contact pads of the package. Thus, after reflowing the bump material, a reliable electrical and mechanical connection may be established between the terminal metal formed on the last metallization layer and the contact pads of the package carrier. In this manner, a very large number of electrical connections may be provided across the entire chip area of the last metallization layer with reduced contact resistance and parasitic capacitance, thereby providing the IO (input/output) capabilities, which may be required for complex integrated circuits, such as CPUs, storage memories and the like. During the corresponding process sequence for connecting the bump structure with a package carrier, a certain degree of pressure and/or heat may be applied to the composite device so as to establish a reliable connection between each of the bumps formed on the chip and the bumps or pads that may be provided on the package substrate. The thermally or mechanically induced stress may, however, also act on the lower lying metallization layers, which may typically include low-k dielectrics or even ultra low-k (ULK) dielectric materials, thereby significantly increasing the probability of creating defects in the form of cracks, delamination and the like, due to the reduced mechanical stability and adhesion to other materials.

Moreover, during operation of the finished semiconductor device attached to a corresponding package substrate, significant mechanical stress may occur due to a significant mismatch in the thermal expansion behavior of the silicon-based semiconductor chip and the package substrate, since, in volume production of sophisticated integrated circuits, economic constraints typically require the use of specified substrate materials for the package, such as organic materials, which typically may exhibit a different thermal conductivity and a coefficient of thermal expansion compared to the silicon chip.

With reference to FIGS. 1a-1b, a typical configuration of a semiconductor device including a solder bump structure for flip chip connection will now be described in more detail.

FIG. 1a schematically illustrates a top view of the configuration or layout of a semiconductor device 100 in which the mechanical and electrical connection between a package and the device 100, i.e., a specific chip or die 101, is to be established on the basis of a solder bump structure, or in sophisticated cases a metal pillar structure. For this purpose, an appropriate distribution of contact elements 110, which will also be referred to herein as chip or die contact elements, across the entire area of the die 101 may be provided, wherein, as previously discussed, nearly the entire area of the die 101 is available for appropriately positioning the contact elements 110. In this manner, a very complex chip-package contact structure may be accomplished, wherein each of the contact elements 110 may be connected to a counterpart contact pad or bump of a corresponding package substrate during a single manufacturing process, contrary to corresponding wire bond techniques in which a bond wire may have to be connected to bond pads of the chip and the package in a substantially sequential manner.

FIG. 1*b* schematically illustrates a cross-sectional view of the device 100 according to the line Ib in FIG. 1*a*. As illustrated, the device 100 comprises the die or chip 101, which may be understood as the basic substrate for forming thereabove circuit elements and the like. The substrate 101 is typically provided in the form of an insulating substrate, a semiconductor material and the like. It should be appreciated that, in and above the substrate 101, typically, a plurality of circuit elements, such as transistors, capacitors, resistors and the like, are provided in accordance with the circuit function to be implemented in the device 100. For convenience, any such circuit elements, which may include elements with critical dimensions of 50 nm and less in sophisticated devices, are not shown in FIG. 1*b*. As discussed above, due to the complex layout of electronic circuits implemented in the semiconductor device 100, a complex metallization system 120 is typically required, which may comprise a plurality of metallization layers stacked on top of each other, wherein, for convenience, a metallization layer 130 and a metallization layer 140 are depicted. For instance, the metallization layer 130 may be comprised of a dielectric material 131, such as a low-k dielectric material, a ULK material and the like, in which metal lines and vias 132 are embedded that are typically comprised of copper, in combination with appropriate conductive barrier materials so as to provide a reliable copper confinement. It should be appreciated that not necessarily each metallization layer of the system 120 may comprise a sensitive low-k dielectric material since different metallization levels may require different performance characteristics, for instance with respect to drive current capability and signal propagation delay. However, at any rate, typically, a plurality of metallization layers may comprise a sensitive low-k dielectric material, thereby reducing the overall mechanical stability, as discussed above. Furthermore, the metallization layer 140 represents the "last" metallization layer and comprises any appropriate dielectric material 141 including metal regions 142, which may represent contact pads for connecting to a contact structure or bump structure 150, which may actually represent the interface for connecting the device 100 with a package substrate (not shown). The contact or bump structure 150 typically comprises a passivation layer 151, which may thus passivate the metallization system 120, wherein, typically, a plurality of dielectric materials, such as silicon dioxide, silicon oxynitride and silicon nitride, are used to provide the desired characteristics in view of chemical and mechanical stability. Moreover, a further dielectric material, such as a polyimide 152, is formed on the passivation material 151. The materials 151 and 152 are patterned in such a way that an opening 150A is aligned to at least a portion of the contact pad 142 of the last metallization layer 140. As explained before, in sophisticated metallization systems, such as the system 120, copper is preferably used which, however, may not be compatible with well-established process techniques and materials as have been used in complex metallization systems formed on the basis of aluminum. For this reason, frequently, a further metal material 153, which is also referred to as a terminal metal, in the form of aluminum, is provided so as to act as an interface between the sensitive copper material of the pad 142 and the contact element 110. In this manner, well-established materials and techniques may be applied for forming the contact element 110, for instance by providing efficient underbump metallization systems 154, for instance based on chromium, copper, tungsten and the like.

In other cases, the contact structure 150 may be formed on the basis of copper metals including any appropriate barrier materials without requiring specific terminal metals, such as the material 153.

The semiconductor device 100 comprising the metallization system 120 may be formed on the basis of the following processes. After completing any semiconductor-based circuit elements, such as transistors and the like, the one or more metallization layers 130, 140 may be formed by providing a material layer and layer stack, which, as discussed above, may comprise extremely sensitive materials, which may then be patterned on the basis of sophisticated lithography techniques and anisotropic etch processes. Thereafter, appropriate barrier materials and copper-based materials may be deposited, for instance in sophisticated dual inlaid techniques, in which vias and metal lines may be filled in a common deposition process. Thereafter, any excess material may be removed, for instance, by chemical mechanical polishing (CMP), wherein a certain mechanical stress may be induced in the sensitive dielectric materials, which may also contribute to a certain degree of deterioration of the mechanical stability of these materials. After completing the metallization layers 130, 140, further complex process techniques may be applied so as to provide the contact structure 150 including the deposition and patterning of the various materials in accordance with the device requirements. After providing the opening 150A, typically, a deposition mask is applied and an appropriate solder material may be deposited and appropriately treated so as to form the contact element 110. In other process strategies, an appropriate metal pillar may be provided in the opening 150A so as to extend above the dielectric layer 152 with a desired height and lateral dimensions, wherein typically an increased contact density may be possible by using appropriate metal pillars, compared to solder bumps.

After separating the semiconductor device 100 into individual chips or dies 101, a connection to an appropriate package substrate may be accomplished by mechanically coupling an individual device 101 and the corresponding package substrate and reflowing the contact elements 110, thereby obtaining the desired intermetallic connection between the contact elements 110 and the corresponding contact pads of the package substrate, which may also comprise a bump structure, depending on the overall process strategy. Finally, any appropriate fill material may be provided between the chip 101, i.e., the contact structure 150, and the package substrate so as to enhance mechanical, chemical and thermal stability of the composite device.

As discussed above, during the fabrication of the semiconductor device 100 and also during the process of connecting the individual chips 101 with a package substrate and in particular during operation of the packaged semiconductor device, significant mechanical stress may be applied to the metallization system 120 via the contact structure 150, i.e., via the contact elements 110. In prior contact technologies, a certain degree of resilience of the contact elements 110 has resulted in a certain degree of buffer effect, due to a significant amount of lead in the composite solder material. Upon introducing so-called lead-free solder materials, however, for instance in view of environmental regulations and the like, and also in an attempt to further improve the thermal and electrical performance of the contact structure 150, for instance by providing copper pillars instead of using bump structures, the mechanical stress in the metallization system 120 may be significantly increased, since typically these materials, and in particular the pillar structures, may be stiffer compared to the lead-containing solder materials, thereby transferring significantly increased shear forces into the metallization system 120 and in particular into the last metallization layer 140. For these reasons, in many conventional approaches, the increase of the mechanical stress in the metallization system 120 may require a reduction in complexity, in terms of providing dielectric materials of superior mechanical stability, thereby, however, typically increasing the dielectric constant and thus reducing the overall electrical performance of the metallization system 120. Thus, monitoring the mechanical characteristics of the sophisticated low-k dielectric materials is an important aspect for complex semiconductor devices, so that conventionally a corresponding process control may be established, in which, in particular, the characteristics of low-k materials may be monitored, for instance by determining several material characteristics after the deposition of these materials.

As discussed above, the material characteristics of low-k dielectric materials as such may represent only one aspect that influences the finally obtained mechanical characteristics of a complex metallization system. Another factor is to be seen in the process history, i.e., the various complex manufacturing processes, which may also influence adhesion and other characteristics of the sensitive materials, which may also finally result in a deterioration of the overall mechanical stability of complex metallization systems. Moreover, the complex interaction of the several layers and materials in a complex metallization system are not appropriately taken into consideration upon monitoring the material characteristics of individual low-k dielectric material layers, thereby resulting in less reliable assessments of metallization systems in terms of reliability upon connecting semiconductor devices to a package and operating a packaged semiconductor device.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides test systems and test procedures for assessing the mechanical characteristics of complex metallization systems of semiconductor devices by mechanically stressing individual chip contact elements, such as solder bumps, metal pillars and the like, and determining the response of the metallization system. The response of the metallization system may be determined on the basis of any appropriate parameter, such as mechanical response, response to any probing externally supplied stimuli, such as electron microscopy, acoustic microscopy, or generally the determination of material characteristics upon exposure to ultrasound, electrical signals obtained from the metallization system during or after the mechanical stressing and the like. Consequently, by applying a mechanical force individually to contact elements, typical degradation mechanisms may be stimulated and may also be monitored and measured in a quantitative manner, which may thus enable an assessment or evaluation of the mechanical status of the metallization system, wherein the material characteristics of sensitive low-k dielectric materials as well as the process history and the complex interaction of the various materials and material systems of the metallization layer may contribute to the response of the metallization system. Consequently, in some illustrative aspects disclosed herein, a critical value for one or more parameters may be established so as to qualify the characteristics of a complex metallization system. For example, one or more parameters may be correlated with device-specific characteristics, such as the behavior of packaged semiconductor devices during stress tests, certain material characteristics, such as irreversible deformations in the form of cracks, and the like, so that, if desired, metallization systems and corresponding manufacturing strategies may not only be evaluated as valid or invalid, but may also be monitored in a more finely resolved manner.

One illustrative method disclosed herein comprises inducing mechanical stress in a dielectric material of a metallization system of a semiconductor device by applying a mechanical force to an individual chip contact element that is formed in the metallization system and that extends above a surface of the dielectric material. The method further comprises determining at least one parameter value indicative of a response of the dielectric material to the induced mechanical stress.

A further illustrative method disclosed herein comprises determining a critical force required to create a non-reversible deformation of a dielectric material of a metallization system of a semiconductor device by applying force to a chip contact element that is formed in the metallization system. The method further comprises using the critical force so as to assess a mechanical stability of the metallization system.

One illustrative measurement system disclosed herein comprises a probe configured to individually apply a force to a chip contact element formed in a metallization system of a semiconductor device. The measurement system further comprises a detection system configured to provide at least one parameter value indicative of a mechanical response of the metallization system to the force applied to the chip contact element.

BRIEF DESCRIPTION OF THE DRAWINGS

The disclosure may be understood by reference to the following description taken in conjunction with the accompanying drawings, in which like reference numerals identify like elements, and in which.

Figures 1A, 1B:
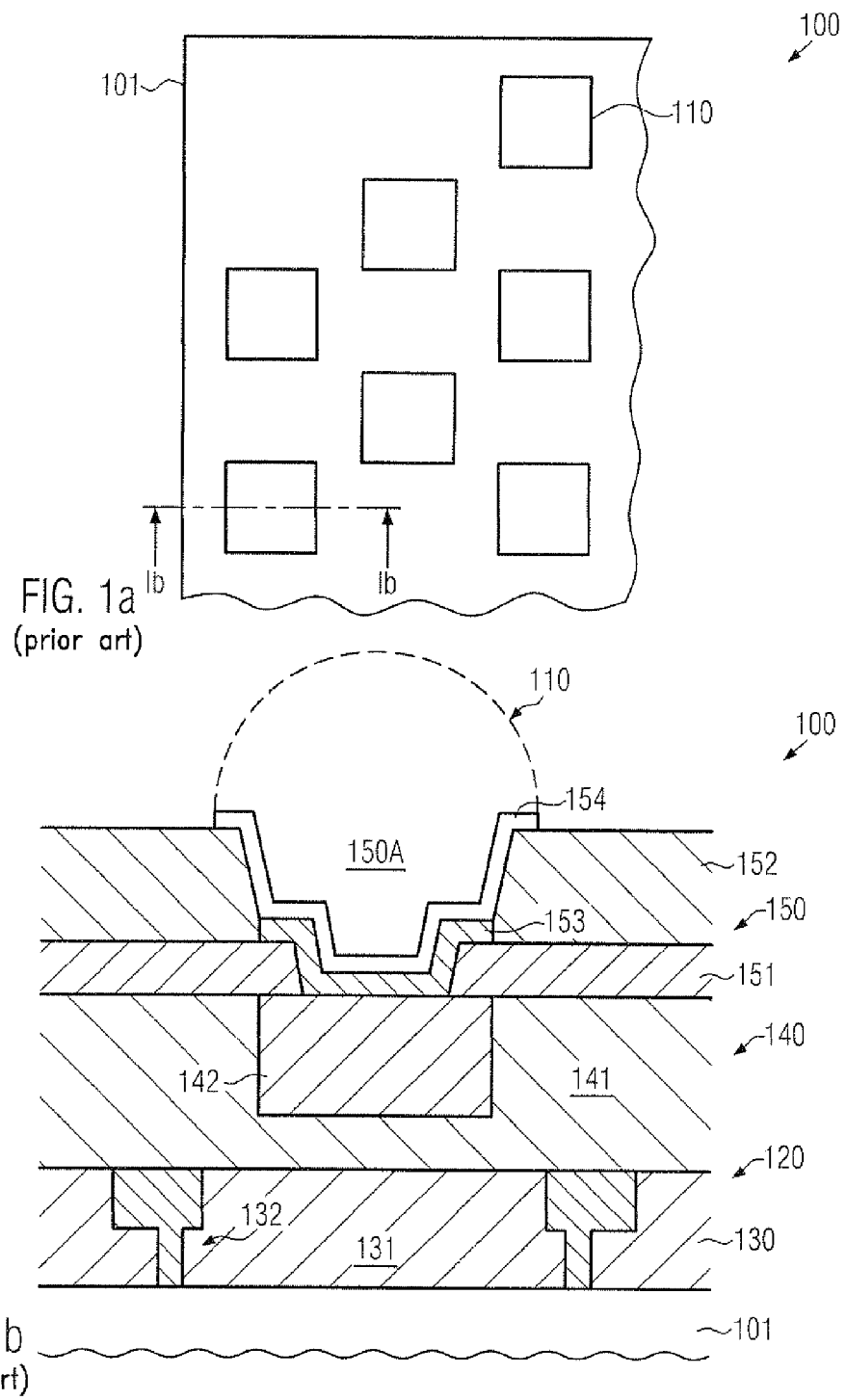
FIG. 1a schematically illustrates a top view of a semiconductor chip or die including a plurality of chip contact elements in the form of solder bumps or metal pillars.
FIG. 1b schematically illustrates a cross-sectional view of a semiconductor device including a metallization system formed on the basis of sensitive low-k dielectric materials and a chip contact structure, according to any appropriate process strategy, FIG. 2a schematically illustrates a cross-sectional view of a measurement system for assessing the mechanical state of a metallization system of a semiconductor device by monitoring at least a mechanical response of the metallization system, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides measurement systems and techniques in which a mechanical force may be efficiently applied to individual chip contact elements in order to monitor the response of the metallization system to the applied mechanical force. As previously discussed, significant shear forces may occur during the packaging of complex semiconductor devices and during the operation of the packaged devices, in particular when using bump structures or pillar structures exhibiting an increased stiffness compared to moderately soft solder materials, such as lead-containing solder materials. By appropriately individually addressing chip contact elements, a well-defined and reproducible mechanical stress may be exerted to the metallization system and in particular to the immediate neighborhood of the contact element, thereby, for instance, creating typical stress conditions, which may allow a qualitative and quantitative estimation of a mechanical status of the metallization system as a whole. For example, by applying a desired lateral force component, for instance, for "tilting" metal pillars or any other solder bumps, compressive and tensile stress components may be induced in the passivation material of the metallization system and may thus also be transferred into lower lying metallization layers. Under such stress conditions, frequently, cracks may occur at the tensile-stressed area of the dielectric material and may thus represent a reliable indicator for qualifying the status of the metallization system. For example, in some illustrative embodiments disclosed herein, the direct mechanical response of the contact element may, therefore, represent an indicator for assessing the mechanical status of the metallization system, since the occurrence of a crack in the vicinity of the chip contact element may be reliably detected by monitoring the response for a varying degree of deformation of the contact element. Since the status of the metallization system may be determined by the complex materials and their interaction, including the complex process history for forming the various material systems, the evaluation of mechanical response of the metallization system as a whole may thus provide superior abilities for assessing the status of a metallization system compared to conventional strategies, in which merely the material characteristics of critical materials, such as low-k and ULK materials, are monitored.

In further illustrative embodiments, the concept of mechanically stressing individual chip contact elements may be combined with several mechanisms for determining one or more properties of the metallization system. In some illustrative embodiments, in addition to or alternatively to monitoring the direct force response of the contact element, the vicinity of the contact element may be monitored on the basis of electron microscopy, thereby obtaining additional information with respect to material characteristics and the like. Furthermore, degradation mechanisms may be monitored while concurrently applying the mechanical stress to the contact element. In other illustrative embodiments, the metallization system may be probed on the basis of acoustic energy, i.e., ultrasound energy, for example in a highly local manner, for instance by restricting the acoustic energy to the vicinity of the contact element under consideration, while, in other cases, a global probing may be applied so as to obtain a more global view of the response of the metallization system to the individual stressing of a contact element. In still other illustrative embodiments, an electrical response of the metallization system may be determined, for instance by monitoring one electrical parameter, such as resistance, capacitance and the like, upon exerting or after exerting mechanical stress to the contact element under consideration.

Consequently, a quantitative correlation may be established, for instance in the form of a simple good/bad criterion, for a metallization system under consideration, thereby enabling a reliable assessment of the metallization systems and corresponding materials and manufacturing strategies used therefor, while, in other cases, a correlation may also be established with respect to the overall reliability over lifetime of packaged semiconductor devices, thereby enabling an assessment of the influence of certain materials and manufacturing processes on the final behavior of the packaged semiconductor devices.

With reference to FIGS. 2a-2i, further illustrative embodiments will now be described, wherein reference is also made to FIGS. 1a-1b, for instance with respect to the structure of a metallization system and the like.

Figure 2A:
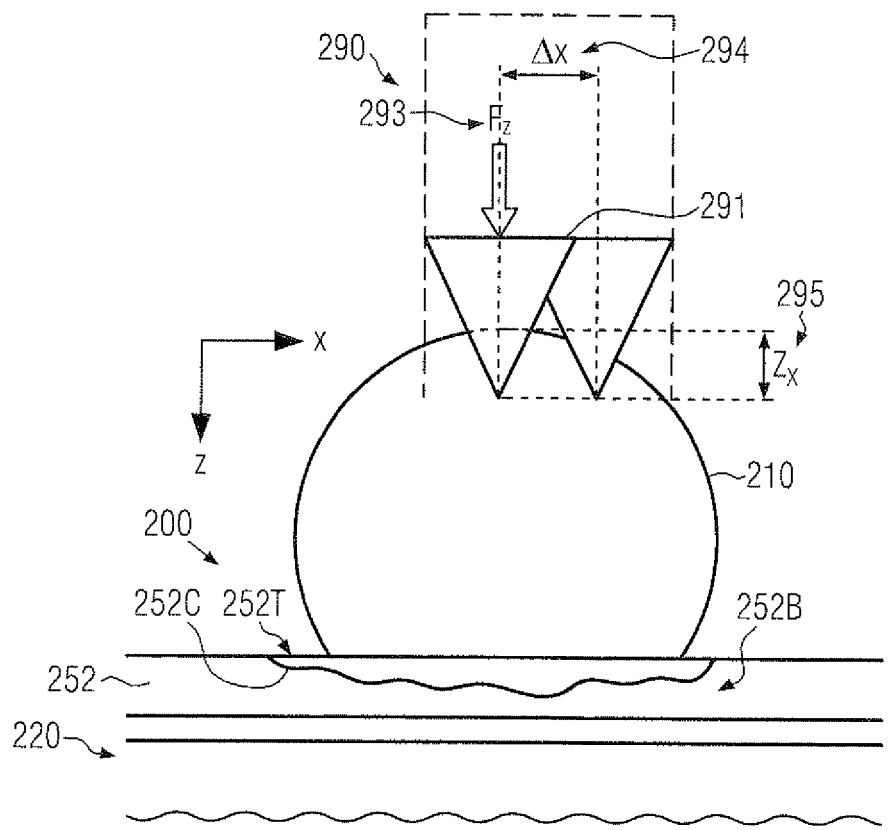
FIGS. 2b-2c schematically illustrate measure results indicating a comparison between a mechanical response of a metallization system in order to identify an irreversible mechanical deformation, in the form of a crack and the like, according to illustrative embodiments.
FIG. 2d schematically illustrates a measurement system according to further illustrative embodiments in which a parameter indicative of the mechanical response may be determined on the basis of electron microscopy.
FIG. 2e schematically illustrates the measurement system according to further illustrative embodiments in which an electrical parameter may be determined in response to a mechanical stress applied to an individual chip contact element.
FIG. 2f schematically illustrates the measurement system according to illustrative embodiments in which one or more material characteristics of the metallization system may be determined on the basis of acoustic energy supplied to the device.
FIG. 2g schematically illustrates the measurement system with a specific environment for the metallization system, for instance in the form of liquids and the like, according to yet other illustrative embodiments.
FIGS. 2h-2i schematically illustrate measurement systems including a different type of applying mechanical force individually to a chip contact element, according to still further illustrative embodiments.

FIG. 2a schematically illustrates a semiconductor device 200 comprising a metallization system 220, which may include a complex material system, for instance based on low-k dielectric materials, ULK materials and the like, as is previously discussed with reference to the semiconductor device 100. Consequently, the metallization system 220 may typically comprise a plurality of metallization layers, wherein a final metallization layer may be connected to a contact structure that is configured for being directly connected to a corresponding contact structure of a carrier package, as is also previously discussed. Thus, the metallization system 220 may comprise a dielectric material 252, which may be considered as a final passivation layer and the like, as is also previously explained with reference to device 100. Furthermore, a representative of a chip contact structure, indicated by a chip contact element 210, may be provided and may connect to any metal region formed within the metallization system 220 which, for convenience, is not illustrated in FIG. 2a. Thus, the contact element 210 may extend above the dielectric material 252 and may also be mechanically attached thereto so that corresponding mechanical forces acting on the contact element 210 may also be transferred into the dielectric material 252 and thus also into the depth of the metallization system 220 to a certain degree, as is also discussed above. In the embodiment shown, the contact element 210 may represent a solder bump comprising a lead-free solder material, while, in other cases, a metal pillar (not shown) may be provided, for instance in the form of a copper pillar, possibly including additional cap materials and the like, as are frequently used in highly sophisticated chip package contact structures.

In order to evaluate the mechanical properties of the metallization system 220, a measurement system 290 may be provided, which may be appropriately configured so as to exert mechanical stress individually to the single contact element 210 in order to apply mechanical stress in the metallization system 220. Furthermore, the measurement system 290 may be appropriately configured so as to detect at least one parameter in a quantitative manner, i.e., to detect a value for the parameter under consideration, so as to enable an evaluation of a response of the system 220 to the mechanical stress applied within the measurement system 290. In the embodiment shown, the measurement system 290 may comprise a probe 291, which may represent a mechanical element that is appropriately dimensioned so as to directly contact the element 210. To this end, the probe 291 may have an appropriate tip, for instance provided in the form of a diamond material, a semiconductor material, an electrically conductive material and the like, which may enable the contacting of the element 210 without a significant deformation of the tip of the probe 291. For example, a plurality of nanoindenter tools are available, which may allow the mechanical contact of semiconductor device features having dimensions of several micrometers, wherein the degree of indentation may be controlled within one micrometer and even less. The capability of providing a well-defined movement of the probe 291, for instance in a direction indicated by Z, i.e., in FIG. 2a, the vertical direction, may be indicated by reference number 295, which is thus to represent any components for initiating a specified movement in this direction, possibly causing a certain degree of deformation or indentation in the element 210, wherein a corresponding force required for contacting the element 210 may be monitored on the basis of appropriate force sensors and the like, which are denoted as 293. Thus, the probe 291 may allow controlled movement along the Z direction and at the same time monitor the required force so as to obtain the specified movement in this direction.

Similarly, the measurement system 290 may comprise a mechanism 294, which may be appropriately configured so as to generate a relative motion between the semiconductor device 200 and the probe 291. For example, any movable stage or substrate holder which may allow a controlled movement at least in a direction indicated by X, i.e., in FIG. 2a, the horizontal direction, may be used in order to induce a relative motion of several micrometers, thereby inducing a certain mechanical stress in the contact element 210 and thus within the metallization system 220. In other cases, the probe 291 may be configured to enable a movement in the X direction while the device 200 may be firmly attached to a substrate holder. Consequently, any known mechanical components and systems for establishing a relative motion within the range of approximately 0-100 μm may be used for the component 294. Furthermore, the measurement system 290 is configured to determine a force component in the X direction, which may generally be accomplished on the basis of a force sensor or any other indicator which is correlated with the resulting force, such as energy supplied to any actuators and the like. A corresponding force detecting system is generally denoted as 295.

Upon operating the measurement system 290, the probe 291 may be brought into mechanical contact with the contact element 210 at a predefined position, i.e., at a predefined position corresponding to the X direction. For contacting the element 210, a predefined deformation or indentation may be created, as is, for instance, indicated by $Z_X$, which may be monitored by the system 295. Thereafter, the system 294 may be activated so as to create a lateral movement, for instance along a predefined distance, as for instance indicated by ΔX. During the corresponding lateral movement, if desired, vertical force may be detected by 293 and the vertical position may be detected by 295, thereby providing information with respect to a deformation of the contact element 210. Furthermore, the current position in the X-direction may be monitored by 294, while at the same time the force required for initiating the lateral movement in the X-direction may be monitored by 294. Consequently, a certain degree of deformation may be caused in the contact element 210, which may also result in mechanical stress in the dielectric layer 252, thereby creating an area of compressive stress 252B at the side of the element 210 facing the direction of movement, while a tensile stress area 252T may be generated on the opposite side, which may, if a sufficiently high stress is achieved, lead to the formation of a crack 252C in immediate proximity to the contact element 210. It should be appreciated that, as previously discussed, the mechanical stress in the layer 252 may depend on the entire configuration of the metallization system 220, so that, for instance, the occurrence of the crack 252C may thus reflect the mechanical status of the metallization system 220 as a whole. That is, the occurrence of the crack 252C may be significantly determined by the mechanical status of the system 220 and may thus occur at different mechanical conditions for different metallization systems 220.

Figure 2B:
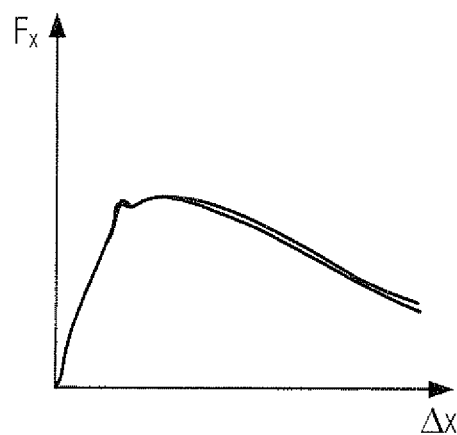

FIG. 2b schematically illustrates a graph indicating measurement results in a schematic manner, which may be obtained from the system 294 determining at least the lateral force component $F_X$. As illustrated, the vertical axis may describe this force component, for instance obtained on the basis of several different force sensors, while the horizontal axis represents the distance along the X direction, indicated as $\Delta X$, i.e., the magnitude of relative motion obtained on the basis of the system 294. As indicated, the force required for initiating the relative motion $\Delta X$ may quickly rise to moderately high values and may then slowly decrease with increasing distance $\Delta X$. For example, the curve illustrated in FIG. 2b may represent the metallization system 220 having a state that may be considered as a valid mechanical state.

Figure 2C:
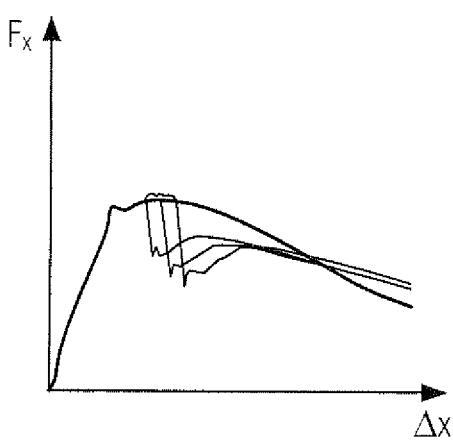

FIG. 2c, on the other hand, represents the curve or curves of the lateral force components for a metallization system 220 in which an irreversible deformation, for instance in the form of the crack 252C, may take place. As indicated, a significant drop of the lateral force component $F_X$ may be identified at a certain small range of relative motion $\Delta X$, thereby clearly indicating the occurrence of the crack 252C. Consequently, on the basis of a plurality of measurement curves, appropriate reference data may be established so as to define a desired quantitative criterion for evaluating the mechanical state of a metallization system of semiconductor devices. For example, a critical force may be identified within a specific range of lateral movement, which may thus indicate a valid metallization system. For the example shown in FIGS. 2b and 2c, a corresponding desired critical force may be identified within a range of $\Delta X$ from 10-20 µm, which may represent the boundary for valid metallization systems, as long as a corresponding measurement result is above a corresponding critical force. It should be appreciated, however, that any other appropriate correlations and criteria may be established on the basis of the mechanical response of the metallization system 220 with respect to the mechanical stress conditions induced by the measurement system 290.

In some illustrative embodiments, the contact element 210 may be provided in the form of a metal pillar, such as a copper pillar, which may have a higher stiffness, compared to solder bumps, thereby inducing an increased mechanical stress in the metallization system 220 for otherwise identical measurement conditions, so that, also in this case, the resulting evaluation of the mechanical status may provide for additional margin in metallization systems in which solder bumps are provided instead of metal pillars. Furthermore, by providing a metal pillar as the contact element 210, a very well-defined surface for being contacted by the probe 291 may be provided, while also a reduced degree of deformation may be caused by the vertical force $F_Z$.

Figure 2D:
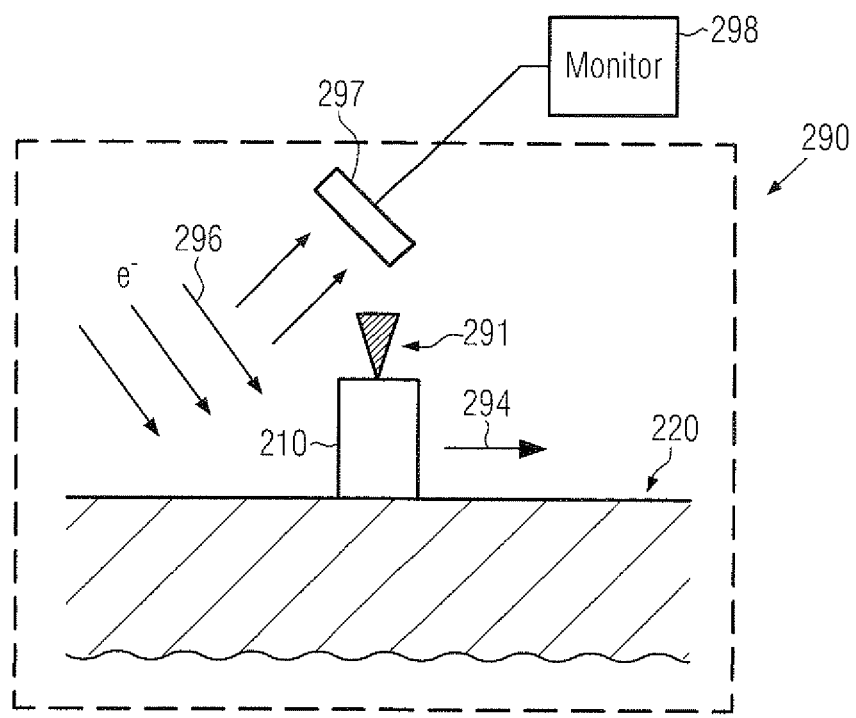

FIG. 2d schematically illustrates the measurement system 290 according to further illustrative embodiments in which, in addition to the probe 291 and the corresponding mechanism (not shown) for operating the probe 291, a monitoring system may be implemented, for instance in the form of a probing beam, such as an electron beam 296, beam detector 297 and a monitor or control unit 298 may be provided. For example, the components 297, 298 may represent a part of a system configured to perform electron microscopy, which, in some illustrative embodiments, may be operated upon applying the mechanical stress to the metallization system 220. Consequently, additional information with respect to material degradation and the like may be obtained from the system 220, preferably in the vicinity of the contact element 210 by using the monitoring system 297, 298. For example, the occurrence of any cracks may be reliably detected on the basis of electron microscopy so that corresponding data obtained from the system 298 may be used for establishing an appropriate correlation between the mechanical stress applied to the contact element 210 and the corresponding mechanical response of the system 220. Moreover, if desired, even substantially continuous material modifications may be observed by the measurement system 290 upon applying mechanical stress to the system 220, such that a correlation with a desired fine resolution with respect to a certain characteristic of the system 220 may be established. For instance, a variation in material density in the vicinity of the contact element 210 may be detected and may be used as an indication of the mechanical response of the system 220 with respect to the applied mechanical stimulus provided by the probe 291.

Figure 2E:
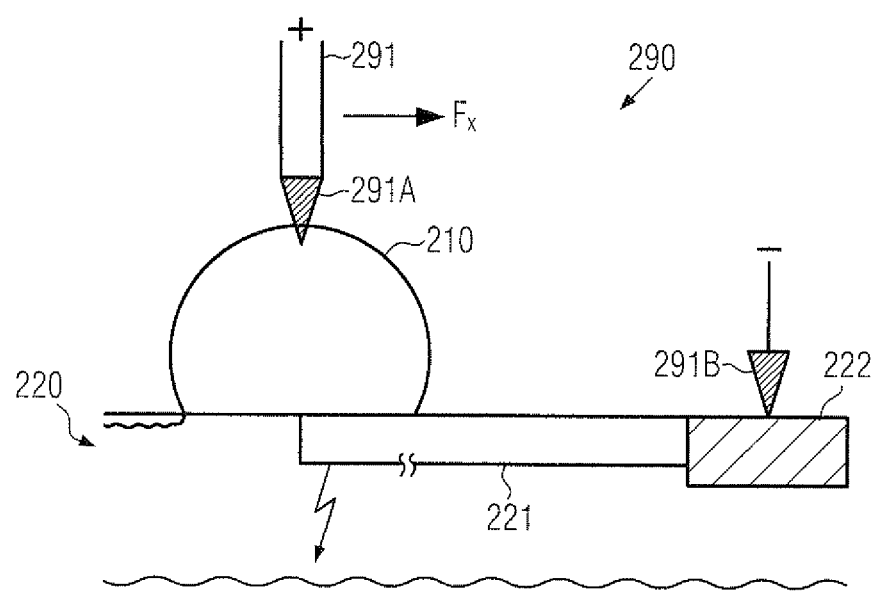

FIG. 2e schematically illustrates the measurement system 290 according to further illustrative embodiments in which, in addition to or alternatively to a pure mechanical indication, such as a lateral force component $F_X$, an electric parameter may be used as a parameter for indicating the state of the system 220. In the embodiment shown, the probe 291 may comprise an electrically conductive probe tip 291A that is in contact with the element 210. Moreover, the contact element 210 may be electrically connected to any type of conductive region 222, such as a contact pad, a contact element similar to the element 210, and the like, via a conductive path 221 established within the metallization system 220. Furthermore, the measurement system 290 may comprise an electrode probe 291B, which may be brought into contact with the conductive region 222. Consequently, when mechanically stressing the contact element 210, the mechanical response of the system 220 may finally result in a contact failure along the path 221, which may thus be detected by the measurement system 290. For example, an increase in resistance or a complete contact failure may be detected upon mechanically stressing the system 220. In this manner, also a parameter value or a value range may be used as a critical parameter for evaluating the mechanical status of the metallization system 220.

It should be appreciated that other electrical parameters may be used, such as the capacitance, inductance and the like, wherein, for instance, a modification of the dielectric characteristics may be detected, which are correlated to the mechanical stress applied to the system 220. In some illustrative embodiments, two electrical probes may be provided, independently from the probe 291, so as to determine an electrical property, such as resistance, capacitance and the like, between corresponding contact elements, the electrical response of which may be influenced by the mechanical stress implied via the contact element 210. For example, the gap between two conductor portions may be influenced by the mechanical stress and the capacitive modifications resulting therefrom may be detected by dedicated electrical probes, without requiring the probe 291 to be electrically conductive.

Figure 2F:
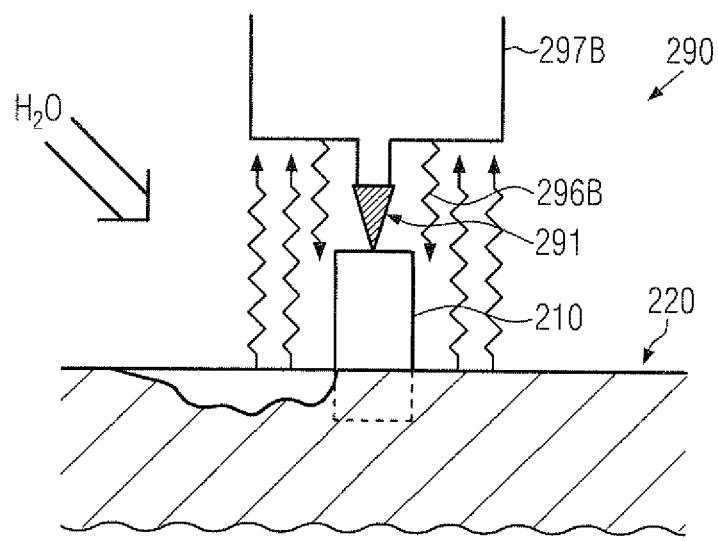

FIG. 2f schematically illustrates the measurement system 290 according to further illustrative embodiments in which the metallization system 220 may be probed by an appropriate mechanism based on acoustic energy 296B. The acoustic energy 296B may be applied to the system 220 in the vicinity of the contact element 210, which may be mechanically accessed by the probe 291. To this end, the system 290 may comprise an appropriate transmitter/receiver for acoustic energy 297B, as may also be used in acoustic microscopy tools and the like. That is, acoustic energy, for instance in the form of ultrasonic sound, of appropriately selected frequencies may be applied to the system 220 and may be reflected therefrom, which may thus be detected by the detector 297B. For example, ultrasonic energy with frequencies up to several GHz may be used, and may thus be sensitive to changes in the surface of the system 220 and also to a certain degree in the depth of the system 220, thereby enabling determining one or more characteristics of the system 220. For example, the formation of any cracks at and near the surface of the system 220 may be efficiently detected on the basis of acoustic mechanisms, for instance, by providing short ultrasound pulses and analyzing the reflected ultrasound pulses. By providing the component 297B in immediate vicinity to the element 210, in particular, cracks may be identified, which may have been caused in the vicinity of the element 210 due to mechanical stressing of dielectric material of the system 220. For example, the component 297B may be mechanically coupled with the probe 291 and may thus represent a part thereof, thereby automatically appropriately aligning the component 297B with the area of interest of the metallization system 220. In other illustrative embodiments (not shown), the component 297B may be individually scanned across a portion of the system 220, thereby increasing the region of interest for obtaining information on any modifications of the metallization system 220. Furthermore, as indicated, ultrasonic sound of high frequencies may require a moderately dense medium for conveying the acoustic energy between the component 297B and the system 220. In this case, an appropriate liquid, such as water, may be applied, for instance in a local manner, so as to obtain appropriate measurement conditions. In other illustrative embodiments, the component 297B may apply the acoustic energy directly via the probe 291 to the contact element 210 and thus to the system 220. In other cases, the component 297B may be directly coupled to the surface 220 so as to excite the surface on the basis of ultrasonic pulses, without requiring any additional intermediate medium.

Figure 2G:
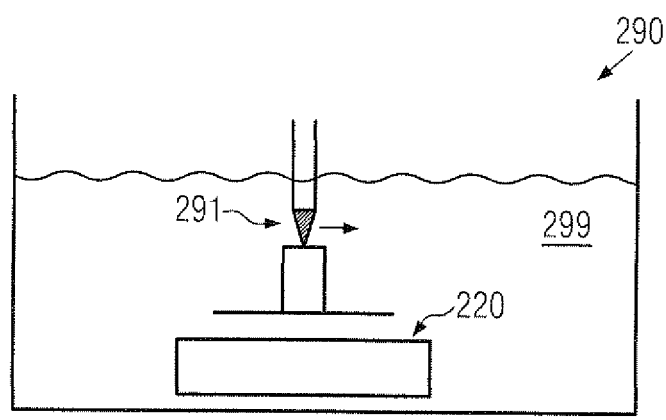

FIG. 2g schematically illustrates the measurement system 290 according to an illustrative embodiment in which the system 290 may be configured to establish specific environmental conditions 299, for instance by immersing the probe 291 and the metallization system 220 into a liquid, such as water and the like, while, in other cases, other environmental conditions may be established in the form of increased temperature, pressure, humidity and the like. For example, by using high pressures or a liquid medium in the environment 299, a global determination of a state of the metallization system 220 may be accomplished, for instance, by ultrasonic probing of the semiconductor device, thereby obtaining information in a more global manner, which may thus also be used as an indication of the response of the metallization system 220 and thus of its mechanical status.

Figure 2H:
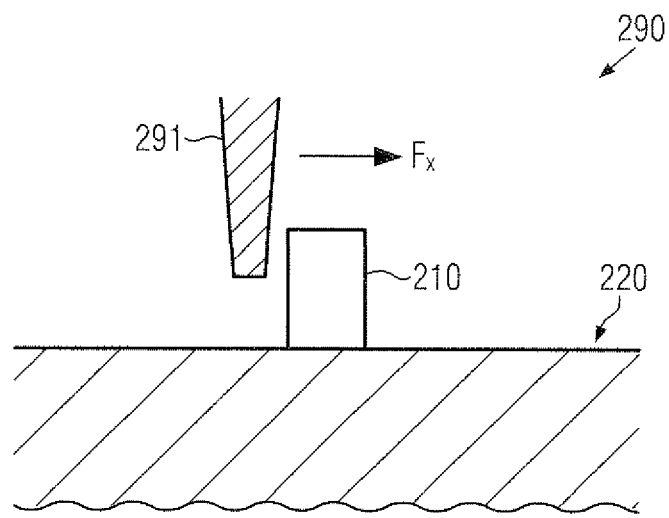

FIG. 2h schematically illustrates the measurement system 290 according to an illustrative embodiment in which the probe 291 may be configured and controlled so as to substantially provide the lateral force component $F_X$ without requiring a significant vertical force component. For example, the shape of the probe 291 may be adapted to the shape of the contact element 210 so as to obtain a large two-dimensional contact area, thereby avoiding pronounced indentations in the contact element 210. Consequently, the resulting force response of the contact element 210 may even more precisely correspond to the mechanical response of the metallization system 220 as a whole.

Figure 2I:
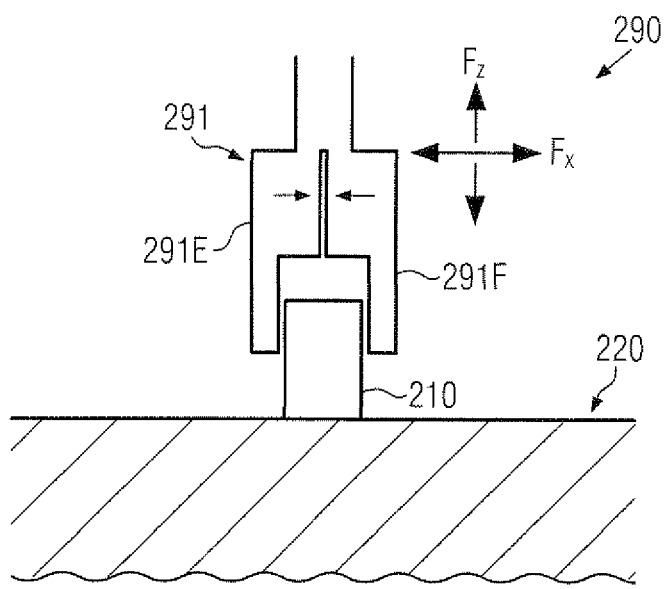

FIG. 2i schematically illustrates the measurement system 290 in which the probe 291 may have any appropriate configuration so as to grasp the contact element 210, which may thus allow applying any type of mechanical stress, such as translational forces, torque forces or any combination thereof. Moreover, in addition to down forces, upward forces may also be applied, thereby providing superior flexibility in designing appropriate test strategies. For example, the probe 291 may have a tweezer-like configuration, for example comprising a plurality of individual components 291E, 291F which may be operated so as to firmly enclose the contact element 210 and thus allow the desired mechanical stimulus to be applied to the contact element 210.

As a result, the present disclosure provides measurement systems and measurement strategies in which the mechanical status of a complex metallization system may be evaluated by providing a mechanical stimulus to an individual chip contact element and by determining at least one parameter value for a parameter that is indicative of the mechanical response of the metallization system to the mechanical stimulus. Since the corresponding mechanical stress applied to the metallization system may be created with high precision and in a reproducible manner, standardized test procedures and test criteria may be established, thereby enabling an efficient evaluation of metallization systems as a whole. Moreover, the test procedures and strategies may be readily correlated with semiconductor devices in further advanced manufacturing stages, i.e., when packaged, thereby providing additional information about the effects of the mechanical status of the metallization system on the reliability, life time and the like of the packaged semiconductor device. For example, the thermal stress induced during the operation of the packaged semiconductor device may be correlated to the mechanical response of the metallization system obtained by the measurement strategies discussed above, so that, for instance, a plurality of parameters may be established with respect to the relevance on reliability and lifetime.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    inducing mechanical stress in a dielectric material of a metallization system of a semiconductor device by applying a mechanical force to an individual chip contact element that is formed in said metallization system and has a surface that extends above a surface of said dielectric material, wherein inducing said mechanical stress and applying said mechanical force is performed by contacting said surface of said chip contact element with a probe; and
    determining at least one parameter value indicative of a response of said dielectric material to said induced mechanical stress.

2. The method of claim 1, wherein said chip contact element is a lead-free solder bump.

3. The method of claim 1, wherein said chip contact element is a metal pillar.

4. The method of claim 1, wherein said metal pillar comprises copper.

5. The method of claim 1, wherein determining at least one parameter value indicative of a response of said dielectric material to said induced mechanical stress comprises monitoring a time progression of at least one mechanical force acting on said chip contact element and associating said time progression with a state of said dielectric material.

6. The method of claim 1, further comprising determining a state of a portion of said surface.

7. The method of claim 6, wherein determining a state of a portion of said surface comprises searching for a crack in said portion.

8. The method of claim 1, wherein determining at least one parameter value indicative of a response of said dielectric material to said induced mechanical stress comprises applying acoustic energy to said metallization system and detecting a reflected acoustic energy obtained from said metallization system.

9. The method of claim 1, wherein determining at least one parameter value indicative of a response of said dielectric material to said induced mechanical stress comprises determining at least one electric property of said metallization system when applying said mechanical force to said chip contact element.

10. The method of claim 9, wherein determining at least one electric property of said metallization system comprises contacting said chip contact element by an electrically conductive probe and establishing a current flow through said chip contact element.

11. The method of claim 1, wherein determining at least one parameter value indicative of a response of said dielectric material to said induced mechanical stress comprises monitoring at least a portion of said dielectric material by electron microscopy when inducing said mechanical stress.

12. The method of claim 1, further comprising assessing a mechanical stability of said metallization system by using said at least one parameter value.

13. A method, comprising:
determining a critical force required to create a non-reversible deformation of a dielectric material of a metallization system of a semiconductor device by applying a mechanical force to a chip contact element formed in said metallization system, wherein said chip contact element has a surface that extends above a surface of said dielectric material and wherein applying said mechanical force is performed by contacting said surface of said chip contact element with a probe; and
using said critical force so as to assess a mechanical stability of said metallization system.

14. The method of claim 13, wherein applying said mechanical force to said chip contact element comprises applying at least a lateral force component so as to induce tensile and compressive stress in a dielectric material provided laterally adjacent to said chip contact element.

15. The method of claim 13, wherein said mechanical force is applied individually to said chip contact element.

16. The method of claim 13, further comprising determining at least one material property of said dielectric material when applying said mechanical force to said chip contact element.

17. The method of claim 16, wherein determining said at least one material property comprises exposing at least a portion of said metallization system to at least one of an electron beam and acoustic energy and detecting a response of said at least a portion of said metallization system to said at least one of an electron beam and acoustic energy.

18. The method of claim 13, further comprising determining at least one electric property of said metallization system after applying said mechanical force to said chip contact element.

19. The method of claim 13, wherein said chip contact element is a lead-free solder bump.

20. The method of claim 13, wherein said chip contact element is a metal pillar.

21. A measurement system, comprising:
a probe configured to individually contact and apply a force to a surface of a chip contact element formed in a metallization system of a semiconductor device wherein the surface of the chip is positioned above the metallization system; and
a detection system configured to provide at least one parameter value indicative of a mechanical response of said metallization system to a stress induced in said metallization system in response to said force applied to said surface of said chip contact element by said probe.

22. The measurement system of claim 21, wherein said at least one parameter value is a magnitude of a lateral force acting on said chip contact element.

23. The measurement system of claim 22, wherein said at least one parameter value comprises at least one of an acoustic signal value, an image of an electron microscope and an electric signal.

24. The system of claim 21, wherein said chip contact element is a lead-free solder bump.

25. The system of claim 21, wherein said chip contact element is a metal pillar.

26. A method, comprising:
inducing mechanical stress in a dielectric material of a metallization system of a semiconductor device by applying a mechanical force to an individual chip contact element formed in said metallization system and extending above a surface of said dielectric material; and
determining at least one parameter value indicative of a response of said dielectric material to said induced mechanical stress, wherein determining said at least one parameter value indicative of a response of said dielectric material to said induced mechanical stress comprises monitoring a time progression of at least one mechanical force acting on said chip contact element and associating said time progression with a state of said dielectric material.

27. A method, comprising:
inducing mechanical stress in a dielectric material of a metallization system of a semiconductor device by applying a mechanical force to an individual chip contact element formed in said metallization system and extending above a surface of said dielectric material; and
determining at least one parameter value indicative of a response of said dielectric material to said induced mechanical stress, wherein determining said at least one parameter value indicative of a response of said dielectric material to said induced mechanical stress comprises monitoring at least a portion of said dielectric material by electron microscopy when inducing said mechanical stress.

28. A method, comprising:
determining a critical force required to create a non-reversible deformation of a dielectric material of a metallization system of a semiconductor device by applying a force to a chip contact element formed in said metallization system;
using said critical force so as to assess a mechanical stability of said metallization system; and determining at least one material property of said dielectric material when applying said force to said chip contact element, wherein determining said at least one material property comprises exposing at least a portion of said metallization system to at least one of an electron beam and acoustic energy and detecting a response of said at least a portion of said metallization system to said at least one of an electron beam and acoustic energy.

* * * * *

UNITED STATES PATENT AND TRADEMARK OFFICE
CERTIFICATE OF CORRECTION

| | | |
|---|---|---|
| PATENT NO. | : 8,479,578 B2 | Page 1 of 1 |
| APPLICATION NO. | : 12/939471 | |
| DATED | : July 9, 2013 | |
| INVENTOR(S) | : Geisler et al. | |

It is certified that error appears in the above-identified patent and that said Letters Patent is hereby corrected as shown below:

In the Claim

Claim 4, at column 14, line 66, delete "1" and insert therefor -- 3 --.

Signed and Sealed this
Twenty-fourth Day of June, 2014

Michelle K. Lee
*Deputy Director of the United States Patent and Trademark Office*